United States Patent [19]

Smith et al.

[11] Patent Number: 5,055,966

[45] Date of Patent: Oct. 8, 1991

[54] VIA CAPACITORS WITHIN MULTI-LAYER, 3 DIMENSIONAL STRUCTURES/SUBSTRATES

[75] Inventors: Hal D. Smith, Rancho Palos Verdes; Robert F. McClanahan, Valencia; Andrew A. Shapiro, Orange; George Pelzman, Segundo, all of Calif.

[73] Assignee: Hughes Aircraft Company, Los Angeles, Calif.

[21] Appl. No.: 628,784

[22] Filed: Dec. 17, 1990

[51] Int. Cl.$^5$ .................. H01L 39/02; H05K 5/00; H01G 4/10
[52] U.S. Cl. .................................. 361/321; 357/80; 174/52.4
[58] Field of Search .............. 357/70, 74, 80, 81; 156/630; 174/52 FP; 333/246, 247; 361/306, 311, 313, 321, 386, 412, 414; 428/137

[56] References Cited

U.S. PATENT DOCUMENTS

| | | | |
|---|---|---|---|
| 4,608,592 | 8/1986 | Miyamoto | 357/80 |
| 4,641,425 | 2/1987 | Dubuisson et al. | 174/68.5 X |
| 4,792,779 | 12/1988 | Pond et al. | 338/195 |
| 4,924,353 | 5/1990 | Patraw | 361/400 |
| 4,925,723 | 5/1990 | Bujatti et al. | 428/137 |
| 4,995,941 | 2/1991 | Nelson et al. | 156/630 |

Primary Examiner—Donald A. Griffin
Attorney, Agent, or Firm—Leonard A. Alkov; Wanda Denson-Low

[57] ABSTRACT

A capacitor structure in a hybrid multilayer circuit having a plurality of insulating layers, the capacitor structure including a dielectric via fill in a via formed in one of the insulating layers, a first conductive element overlying the dielectric via fill, and a second conductive element underlying said dielectric via fill. Each of the first and conductive elements comprises a conductive via fill or a conductive trace.

9 Claims, 2 Drawing Sheets

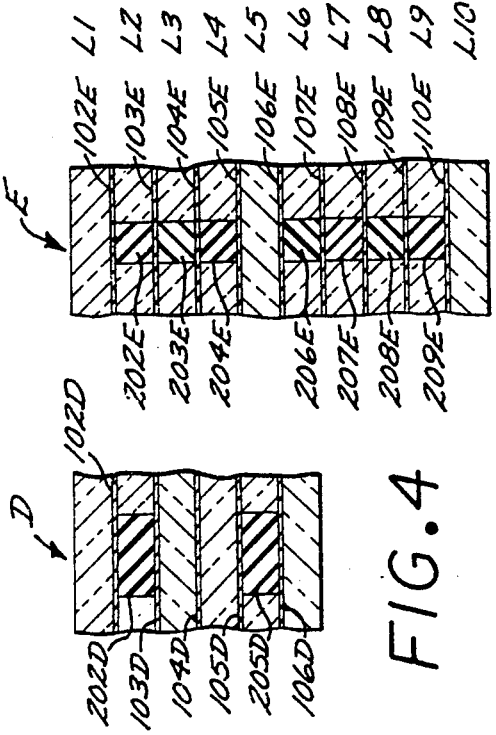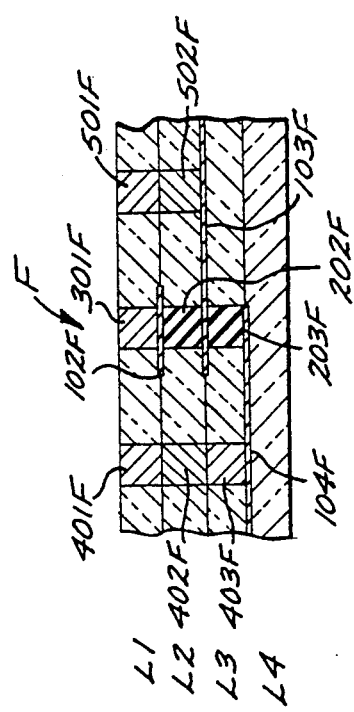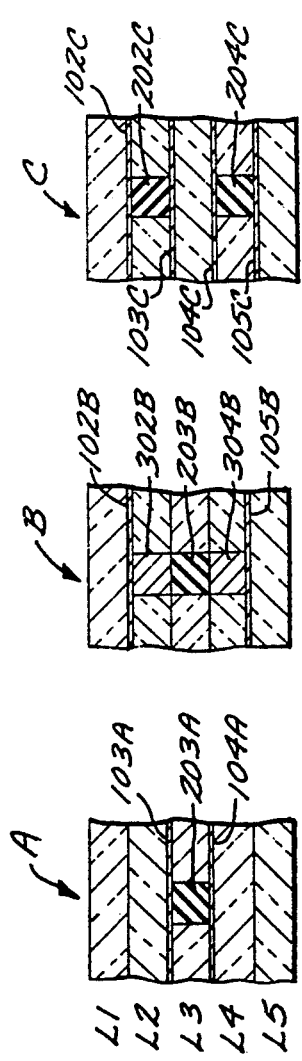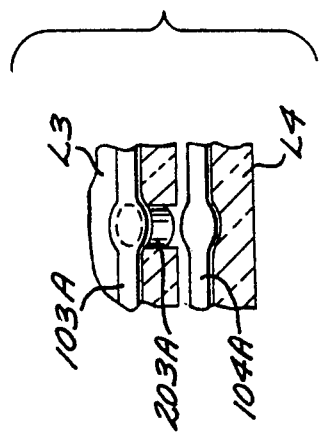

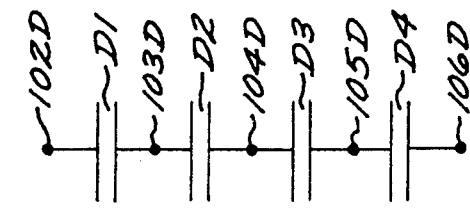
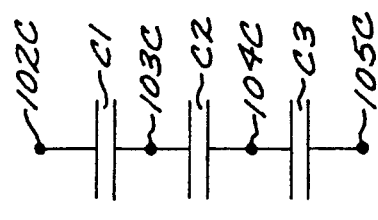
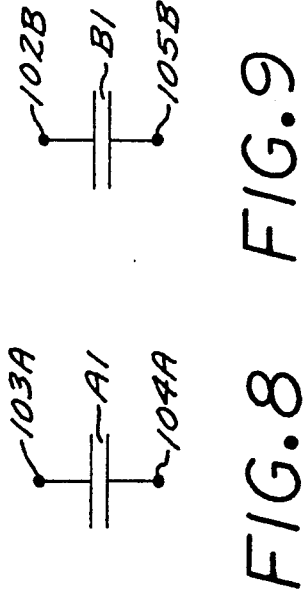
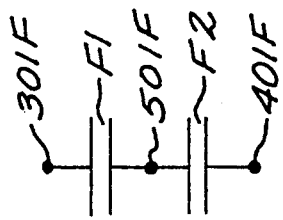

VIA CAPACITORS WITHIN MULTI-LAYER, 3 DIMENSIONAL STRUCTURES/SUBSTRATES

BACKGROUND OF THE INVENTION

The disclosed invention is directed generally to hybrid multilayer circuit structures, and is directed more particularly to hybrid multilayer circuit structures having capacitors formed in the vias thereof.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on an insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive material, whereby the conductive material is in contact with predetermined conductive traces between the layers that extend over or under the vias.

The traditional thick film processes for making capacitors involves screen printing a first capacitor plate on one of the dielectric layers, forming a capacitor dielectric layer over the first capacitor plate, and then forming a second capacitor plate over the dielectric layer. For example, the capacitor dielectric layer is formed by screen printing on the first capacitor plate, and the second capacitor plate is formed by screen printing on the capacitor dielectric or on the bottom side of the dielectric layer that overlies the layer on which the first capacitor plate is formed.

A consideration with screen printed capacitors is the difficulty in controlling their values, and the requirement for precision capacitors is met by mounting discrete capacitors on the top dielectric layer along with other discrete devices, and/or by forming screen printed capacitors on the top layer which are trimmed, for example, by laser or abrasive trimming. The requirement for precision capacitors has also been met by formation and trimming of buried screen printed capacitors, as disclosed in commonly assigned U.S. Pat. No. 4,792,779.

A further consideration with screen printed capacitors as well as discrete capacitors is the substrate area utilized by such components.

SUMMARY OF THE INVENTION

It would therefore be an advantage to provide for capacitors for multilayer hybrid circuits having reduced substrate space requirements.

Another advantage would be to provide for capacitors for multilayer hybrid circuits having precisely controllable values as well as precisely controllable ratios.

The foregoing and other advantages are provided by the invention in a via capacitor structure for a hybrid multilayer circuit having a plurality of insulating layers. The via capacitor structure includes a dielectric via fill in a via formed in one of the insulating layers, a first conductive component overlying the dielectric via fill and a second conductive component underlying the dielectric via fill. The first and second conductive components comprise conductor traces or conductive via fills.

BRIEF DESCRIPTION OF THE DRAWINGS

The advantages and features of the disclosed invention will readily be appreciated by persons skilled in the art from the following detailed description when read in conjunction with the drawing wherein:

FIGS. 1-6 are schematic sectional views of illustrative examples of via capacitor structures in accordance with the invention.

FIG. 7 is a schematic partially exploded view of the capacitor structure of FIG. 1 illustrating the components of the capacitor structure.

FIGS. 8-12 are schematic circuit diagrams of the capacitor structures of FIGS. 1-4 and 6.

DETAILED DESCRIPTION OF THE DISCLOSURE

In the following detailed description and in the several figures of the drawing, like elements are identified with like reference numerals.

Via capacitor structures in accordance with the invention are implemented in a unitized multilayer circuit structure that is utilized for interconnecting various discrete circuits mounted on the outside thereof. The unitized multilayer circuit structure is formed from a plurality of insulating layers (comprising ceramic, for example), conductive traces disposed between the layers, and conductive vias formed in the layers which together with any buried elements (e.g., elements formed on the top of an insulating layer and covered by an overlying insulating layer) are processed to form an integrally fused unitized multilayer structure. The discrete circuits are typically mounted and electrically connected on the outside of the unitized multilayer circuit structure after the unitizing fabrication.

FIGS. 1-6 schematically depict the implementation of illustrative examples of via capacitor structures A, B, C, D, E, F in accordance with the invention. Each via capacitor structure includes one or more via capacitors respectively comprising conductive regions separated by a dielectric region, wherein the conductive regions comprise conductor traces or conductive via fills and the dielectric region comprises a dielectric via or a region of a dielectric layer between the conductive regions. The via capacitor structure of FIG. 6 illustrates a structure by which the terminals of the via capacitors can be accessed by external electrical connections on the outside of the unitized multilayer circuit structure.

In the following description, the different elements of the via capacitor structures will be referenced as follows. Conductor traces are identified by reference numerals in the form of 10XY, wherein X is the layer number on which the trace is formed (for example, pursuant to single side printing) and Y is the particular capacitor structure A, B, C, etc. Dielectric via fills are identified by reference numerals in the form of 20XY, wherein X is the layer number in which the dielectric via fill is formed and Y is the particular capacitor structure A, B, C, etc. Conductive via fills are identified by reference numerals in the form of 30XY, 40XY, 50XY, wherein X is the layer number in which the conductive via fill is formed and Y is the particular capacitor structure A, B, C, etc.

FIG. 1 illustrates a capacitor structure A that includes a dielectric via fill 203A formed in a via in the layer L3, a conductive trace 103A overlying the dielectric via fill 203A, and a conductive trace 104A underlying the dielectric via fill 203A. FIG. 7 is a schematic representation of the structural components of the capacitor structure A, and is representative of structural components of the via capacitor structures disclosed further herein.

The via capacitor structure A forms a single capacitor whose plates comprise the portions of the conductive traces 103A, 104A that overlie and underlie the dielectric via fill 203A and which is accessed by such conductive traces. An equivalent circuit of the via capacitor structure A is shown in FIG. 7, with the terminals of the capacitor being identified by the reference numerals of the conductive traces.

FIG. 2 illustrates a capacitor structure B that includes a dielectric via fill 203B formed in a via in the layer L3, a first conductive via fill 302B in a via in the insulating layer L2 that is above the layer L3, and a second conductive fill 304B in a via in the insulating layer L4 that is below the layer L3. The capacitor structure 15 further includes a conductive trace 102B overlying the conductive via fill 302B and a conductive trace 105B underlying the conductive via fill 304B.

The via capacitor structure B comprises a single capacitor that is accessed by the conductive traces 102B, 105B. An equivalent circuit of the via capacitor structure B is shown in FIG. 8, with the terminals of the capacitor being identified by the reference numerals of the conductive traces.

FIG. 3 illustrates a stacked capacitor structure C that includes a first dielectric via fill 202C formed in a via in the layer L2 and a second dielectric via fill 204C formed in a via in the layer L4. The capacitor structure C further includes a conductor trace 102C that overlies the dielectric via fill 202C, a conductor trace 103C that underlies the via fill 202C, a conductor trace 104C that overlies the dielectric via fill 204C, and a conductor trace 105C that underlies the dielectric via fill 204C.

The via capacitor structure C includes a plurality of capacitors that can be respectively accessed by the appropriate conductive traces. An equivalent circuit of the via capacitor structure C is shown in FIG. 10, with the terminals of the different capacitors being identified by the reference numerals of the conductive traces by which they can be accessed. In particular, a first capacitor C1 having its dielectric region formed by the dielectric via fill 202C can be accessed by the conductor traces 102C, 103C; a second capacitor C2 having its dielectric region formed by a portion of the layer L3 can be accessed by the conductor traces 103C, 104C; and a third capacitor C3 having its dielectric region formed by the dielectric via fill 204C can be accessed by the conductor traces 104C, 105C. It should also be appreciated that the capacitor C1 can include a conductive filled via overlying the dielectric via fill 202C, whereby the capacitor C1 can be accessed by connection on top of the layer L1. Such conductive fill can be in addition to or in lieu of the conductive trace 102C, depending upon the particular requirements.

By appropriate connections of conductor traces, the capacitors C1, C2, C3 can be in connected in parallel and or serial configurations, or they can individually be shorted. For example, if the conductor trace 102C is electrically connected to the conductor trace 104C, the capacitors C1 and C2 would be in parallel. All three capacitors can be connected in parallel by electrically connecting the conductor traces 102C and 104C and electrically connecting the conductor traces 105C and 103C. As a further example, the capacitor C3 can be shorted by electrically connecting the conductor traces 104C and 105C. As illustrated further herein, the connections between the terminals of the via capacitors can be made after the hybrid is fabricated by including appropriate vias.

FIG. 4 illustrates a stacked capacitor structure D which is similar to the via capacitor structure C of FIG. 3 except that the capacitor structure D includes larger dielectric via fills and includes 2 capacitors having dielectric regions formed by regions of the layers L3, L4. The via capacitor structure D more particularly includes first and second dielectric via fills 202D, 205D formed in vias in the layers L2 and L5, a conductive trace 102D overlying the dielectric via fill 202D, a conductive trace 103D underlying the dielectric via fill 202D, a conductive trace 104D between the layers L2 and L3, a conductive trace 105D overlying the dielectric via fill 205D, and a conductive trace 106D underlying the dielectric via fill 205D.

The via capacitor structure D includes a plurality of capacitors that can be respectively accessed by the appropriate conductive traces. An equivalent circuit of the via capacitor structure D is shown in FIG. 11, with the terminals of the different capacitors being identified by the reference numerals of the conductive traces by which they can be accessed. In particular, a first capacitor D1 having its dielectric region formed by the dielectric via fill 202D can be accessed by the conductor traces 102D, 103D. A second capacitor D2 having its dielectric region formed by a portion of the layer L3 can be accessed by the conductor traces 103D, 104D. A third capacitor D3 having its dielectric region formed by a portion of the layer L4 can be accessed by the conductor traces 104D, 105D. A fourth capacitor D4 having its dielectric region formed by the dielectric via fill 205D can be accessed by the conductor traces 105D, 106D.

As with the multiple capacitor structure C of FIG. 3, the capacitors D1, D2, D3, D5 can be interconnected in various serial and parallel configurations, or they can be individually shorted as required.

FIG. 5 illustrates another stacked capacitor structure E that includes upper dielectric via fills 202E, 203E, 204E in vias formed in contiguous layers L2, L3, L4; and lower dielectric via fills 206E, 207E, 208E, 209E in axially aligned vias formed in contiguous insulating layers L6, L7, L8, L9. The capacitor structure E further includes a conductive trace 102E through 110E which overlie and/or underlie the dielectric via fills.

The via capacitor structure E includes a plurality of capacitors that are accessed by connections to the conductive traces 102E–110E. The equivalent circuit schematic for the capacitor structure E would be similar to that of the capacitor structure D, except that there would be 8 capacitors. As with the other multiple capacitor structures, the capacitors of the capacitor structure E can be configured in varying serial and/or parallel configurations, or they can be selectively shorted by appropriate via interconnects.

FIG. 6 sets forth a stacked capacitor structure F that includes a conductive via structure by which the via capacitors are accessible external electrical connections made on the outside of the unitized multilayer circuit structure. The capacitor structure F includes a first dielectric via fill 202F formed in a via in the layer L2 and a second dielectric via fill 203F formed in a via in the layer L3. A conductive via fill 301F overlies the dielectric via fill 202F and extends to the outside of the unitized multilayer circuit structure so as to be available for external electrical connection. A conductive trace 102F between the layers L1 and L2 may be included for interconnection. A conductive trace 103F underlies the dielectric via fill 202F and overlies the dielectric via fill 203F, and a conductive trace 104F underlies the dielectric via fill 203F.

Standard conductive via fills 401F, 402F, 403F are electrically connected to the conductive trace 104F to provide electrical access to the conductive trace by external connection to the top of the conductive via fill 401F which extends to the outside of the unitized multilayer circuit structure and is available for external connection. Standard conductive via fills 501F, 502F are electrically connected to the conductive trace 103F to provide electrical access to the conductive trace by external connection to top of the conductive via fill 501F which extends to the outside of the unitized multilayer circuit structure and is available for external connection. Effectively, the conductive vias electrically connect the capacitors to the outside of the unitized multilayer circuit structure where external connections can be made.

An equivalent circuit of the via capacitor structure F is shown in FIG. 12, with the terminals of the capacitors identified by the reference numerals of the conductive via fills that extend to the outside of the unitized multilayer circuit structure. Connection of the conductive via fill 401F to the conductive via fill 301F, for example, by wire bonding, connects the capacitors F1 and F2 in parallel. Connecting the conductive via fill 301F to the conductive via fill 501F shorts the capacitor F1.

For more extensive stacked capacitor structures such as the capacitor structure E shown in FIG. 5, the capability for external electrical connections can be provided by respective axially aligned conductive vias for selected buried conductor traces in contact with via capacitors, wherein the conductive vias for each trace extends upwardly from the trace through the top layer L1. By way of illustrative example, the via structures comprising respective aligned vias can be arranged in a circular pattern around the axis of the aligned dielectric via fills of the capacitor structure, with each conductive via structure extending downwardly to a different layer.

It should be appreciated that, depending on factors affecting the electrical and thermal integrity of the unitized multilayer circuit structure, stacked capacitors in accordance with the invention can be axially aligned or staggered wherein via dielectric via fills in any two adjacent layers are not axially aligned.

It should be also appreciated that laterally separated via capacitor structures in accordance with the invention can be interconnected by external connections on the outside of the unitized multilayer circuit structure, and that interconnection can also be made by selectively cutting conductive traces on the top layer that are formed as part of the unitizing multilayer structure fabrication so as to selectively sever electrical connections between conductive via fills and/or conductive traces overlying dielectric via fills. For example, a plurality of via capacitors could be connected in a parallel circuit by conductive traces on the outside of the unitized multilayer circuit structure, and selected capacitors could be removed from the circuit by cutting appropriate conductor traces by laser cutting or abrasion, for example.

While the foregoing has shown via capacitor structures with dielectric via fills in adjacent layer being separated by intervening conductor traces, it should be appreciated that via capacitor structures in accordance with the invention can include a plurality of axially aligned adjacent dielectric via fills without intervening conductive traces. In other words, the conductor traces are located as required to achieve the desired capacitance values and interconnection capabilities.

The values of the via capacitors in the via capacitor structures are controlled by (a) the cross-sectional area of the filled vias parallel to the capacitor plates, (b) the electrical characteristics of the dielectric via fill material, (c) the number and thicknesses of insulating layers between the conductive components of the capacitor (i.e., conductive traces or conductive via fills, and (d) the number and thicknesses of dielectric via fills between the conductive components of a capacitor, wherein the thickness of a dielectric via fill is determined by the thickness of the insulating layer in which it is formed.

Ratioed capacitors (i.e., capacitors whose values have predetermined ratios relative to each other) are readily made with the via capacitors of the invention by appropriately varying the diameter of the vias for the dielectric via fills or utilizing dielectric via fills having different dielectric constants. Thus, for example, for a given dielectric via fill material and the same dielectric via fill thickness, a via capacitor having a dielectric fill via that has twice the area of another capacitor would have a capacitance value that is twice the capacitance value of such other capacitor.

In terms of applications, via capacitors in accordance with the invention that are accessible after hybrid fabrication are advantageously utilized for tuning. In particular, the accessible via capacitors are connected or shorted as required by the particular RF circuit with which the hybrid is used.

The conductive via fills can comprise standard via fill material as traditionally utilized for interconnections, and examples of commercially available dielectric fill materials include Remex 7210, ESL 4113, and DuPont 8289.

The capacitor structures in accordance with the invention are made, for example, pursuant to low temperature co-fired processing such as disclosed in "Development of a Low Temperature Cofired Multilayer Ceramic Technology," by William A. Vitriol et al., 1983 ISHM Proceedings, pages 593–598; "Processing and Reliability of Resistors Incorporated Within Low Temperature Cofired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In accordance with low temperature co-fired processing, vias are formed in a plurality of green thick film tape layers at locations defined by the desired via configurations of the desired multilayer circuit. The vias are filled with the appropriate conductive and dielectric fill material, for example, by screen printing. Conductor metallization for conductive traces including those that form or access the via capacitors are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate.

The foregoing has been a disclosure of a via capacitor structure for multilayer hybrid circuits which advantageously utilizes vias to provide for increased circuit packing density and which easily provides for precision and ratioed capacitors. The via capacitor structure of the invention further provides for capacitor circuitry whose connections can be modified after fabrication of the hybrid in which they are implemented.

Although the foregoing has been a description and illustration of specific embodiments of the invention, various modifications and changes thereto can be made by persons skilled in the art without departing from the scope and spirit of the invention as defined by the following claims.

What is claimed is:

1. A capacitor structure in a hybrid multilayer, circuit having a plurality of insulating layers, comprising:
   a dielectric via fill in a via formed in one of the insulating layers;
   first conductive means overlying said dielectric via fill; and
   second conductive means underlying said dielectric via fill.

2. The capacitor structure of claim 1 wherein one of said first and second conductive means comprises a conductive trace.

3. The capacitor structure of claim 1 wherein one of said first and second conductive means comprises a conductive via fill.

4. A capacitor structure in a hybrid multilayer circuit having a plurality of insulating layers, comprising:
   a first dielectric via fill in a via formed in a first insulating layer of the hybrid;
   a second dielectric via fill formed in a via in a second insulating layer;
   a dielectric region in each of at least one insulating layer between said first and second insulating layers; and
   conductive means overlying and/or underlying said dielectric via fills.

5. A capacitor structure in a hybrid multilayer circuit having a plurality of insulating layers, comprising:
   a first group of dielectric via fills in first vias in a first group of adjacent insulating layers;
   a second group of dielectric via fills in second vias in a second group of adjacent insulating layers;
   a dielectric region in each of at least one insulating layer between said first group of adjacent insulating layers and said second group of adjacent insulating layers; and
   conductive means overlying and/or underlying said dielectric via fills.

6. A capacitor structure in a hybrid multilayer circuit having a plurality of insulating layers, comprising:
   one or more axially aligned dielectric via fills in respective vias formed in respective adjacent insulating layers; and
   first conductive means disposed over said one or more axially aligned dielectric via fills; and
   second conductive means disposed beneath said one or more dielectric via fills.

7. The capacitor structure of claim 6 wherein one or both of said first and second conductive means comprises a conductive via fill.

8. The capacitor structure of claim 6 wherein one or both of said first and second conductive means comprises a conductor trace.

9. A capacitor structure in a hybrid multilayer circuit having a plurality of insulating layers, the capacitor structure comprising:
   a plurality of dielectric via fills;
   a plurality of conductive elements overlying and/or underlying said dielectric via fills and cooperating therewith to form via capacitors; and
   a plurality of conductive via fills for electrically connecting selected ones of said conductive elements to areas of the hybrid that are accessible for connection after fabrication of the hybrid, whereby said via capacitors can be connected or shorted as required.

* * * * *